(12) United States Patent
van der Burgt et al.

(10) Patent No.: US 9,588,430 B2
(45) Date of Patent: Mar. 7, 2017

(54) SYSTEM AND METHOD TO ADAPTIVELY PRE-COMPENSATE FOR TARGET MATERIAL PUSH-OUT TO OPTIMIZE EXTREME ULTRAVIOLET LIGHT PRODUCTION

(71) Applicant: ASML Netherlands B.V., Veldhoven (NL)

(72) Inventors: Jeroen van der Burgt, Eindhoven (NL); Matthew R. Graham, San Diego, CA (US); Charles Kinney, San Diego, CA (US); Wayne J. Dunstan, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/995,166

(22) Filed: Jan. 13, 2016

(65) Prior Publication Data

US 2016/0202614 A1 Jul. 14, 2016

Related U.S. Application Data

(63) Continuation of application No. 13/631,645, filed on Sep. 28, 2012, now Pat. No. 9,238,243.

(51) Int. Cl.
| | |
|---|---|
| *H05H 1/24* | (2006.01) |
| *G03F 7/20* | (2006.01) |
| *B05B 17/00* | (2006.01) |
| *H05G 2/00* | (2006.01) |

(52) U.S. Cl.
CPC ......... *G03F 7/70033* (2013.01); *B05B 17/00* (2013.01); *H05G 2/006* (2013.01); *H05G 2/008* (2013.01); *H05H 1/24* (2013.01)

(58) Field of Classification Search
CPC ........ H05G 2/003; H05G 2/006; H05G 2/005; G03F 7/70033; G21K 5/10
See application file for complete search history.

(56) References Cited

U.S. PATENT DOCUMENTS

| | | | | |
|---|---|---|---|---|
| 4,872,189 A | * | 10/1989 | Frankel | B82Y 10/00 378/119 |
| 7,718,985 B1 | * | 5/2010 | Bernath | H05G 2/008 250/492.2 |

(Continued)

*Primary Examiner* — Brooke Purinton
(74) *Attorney, Agent, or Firm* — Gard & Kaslow LLP

(57) ABSTRACT

Energy output from a laser-produced plasma (LPP) extreme ultraviolet light (EUV) system varies based on how well the laser beam is focused on droplets of target material to generate plasma at a primary focal spot. Maintaining droplets at the primary focal spot during burst firing is difficult because generated plasma from preceding droplets push succeeding droplets out of the primary focal spot. Current droplet-to-droplet feedback control to re-align droplets to the primary focal spot is relatively slow. The system and method described herein adaptively pre-compensate for droplet push-out by directing droplets to a target position that is offset from the primary focal spot such that when a droplet is lased, the droplet is pushed by the laser beam into the primary focal spot to generate plasma. Over time, the EUV system learns to maintain real-time alignment of droplet position so plasma is generated consistently within the primary focal spot.

16 Claims, 13 Drawing Sheets

(56) References Cited

U.S. PATENT DOCUMENTS

| | | | |
|---|---|---|---|
| 2007/0152175 A1* | 7/2007 | Moors ................. | G03F 7/70033 250/493.1 |
| 2010/0149516 A1* | 6/2010 | Loopstra ............. | G03F 7/70525 355/74 |
| 2010/0294958 A1* | 11/2010 | Hayashi ................ | H05G 2/006 250/504 R |
| 2012/0305811 A1* | 12/2012 | Wakabayashi ......... | H05G 2/008 250/504 R |
| 2016/0066401 A1* | 3/2016 | Yabu ..................... | H05G 2/006 250/504 R |
| 2016/0234920 A1* | 8/2016 | Suzuki ..................... | G03F 7/20 |

* cited by examiner

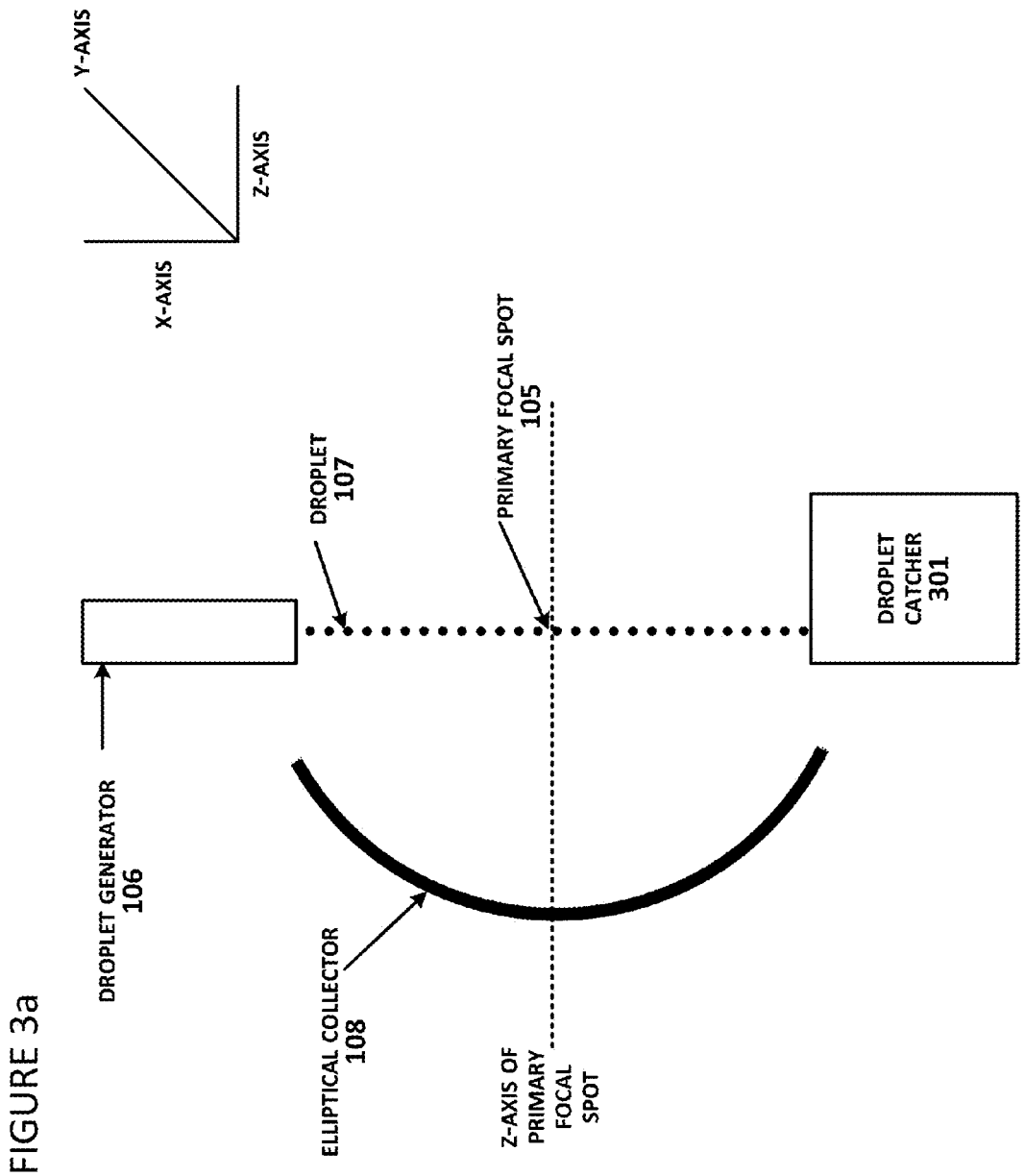

SYSTEM AND METHOD TO ADAPTIVELY PRE-COMPENSATE FOR TARGET MATERIAL PUSH-OUT TO OPTIMIZE EXTREME ULTRAVIOLET LIGHT PRODUCTION

BACKGROUND OF THE INVENTION

Field of the Invention

The present invention relates generally to laser technology for photolithography, and, more particularly, to optimization of extreme ultraviolet (EUV) light production.

Description of the Prior Art

The semiconductor industry continues to develop lithographic technologies which are able to print ever-smaller integrated circuit dimensions. Extreme ultraviolet ("EUV") light (also sometimes referred to as soft x-rays) is generally defined to be electromagnetic radiation having wavelengths of between 10 and 110 nm. EUV lithography is generally considered to include EUV light at wavelengths in the range of 10-14 nm, and is used to produce extremely small features (e.g., sub-32 nm features) in substrates such as silicon wafers. These systems must be highly reliable and provide cost-effective throughput and reasonable process latitude.

Methods to produce EUV light include, but are not necessarily limited to, converting a material into a plasma state that has one or more elements (e.g., xenon, lithium, tin, indium, antimony, tellurium, aluminum, etc.) with one or more emission line(s) in the EUV range. In one such method, often termed laser-produced plasma ("LPP"), the required plasma can be produced by irradiating a target material, such as a droplet, stream or cluster of material having the desired line-emitting element, with a laser beam at an irradiation site.

The line-emitting element may be in pure form or alloy form (e.g., an alloy that is a liquid at desired temperatures), or may be mixed or dispersed with another material such as a liquid. Delivering this target material and the laser beam simultaneously to a desired irradiation site (e.g., a primary focal spot) within an LPP EUV source plasma chamber for plasma initiation presents certain timing and control problems. Specifically, it is necessary for the laser beam to be focused on a position through which the target material will pass and timed so as to intersect the target material when it passes through that position in order to hit the target properly to obtain a good plasma, and thus, good EUV light.

A droplet generator heats the target material and extrudes the heated target material as droplets which travel along an x-axis of the primary focal spot to intersect the laser beam traveling along a z-axis of the primary focal spot. Ideally, the droplets are targeted to pass through the primary focal spot. When the laser beam hits the droplets at the primary focal spot, EUV light output is maximized.

When the laser fires, however, plasma formed from preceding droplets within a burst interferes with trajectories of succeeding droplets within the burst, pushing the droplets out of the x-axis of the primary focal spot. The result is that the droplets are displaced ("pushed-out") along the y- and/or z-axes away from the primary focal spot when hit by the laser beam. This push-out ramps up rapidly (e.g., in about 15-20 ms) and can be quite large (e.g., 120 μm displacement from the primary focal spot). The large and rapid nature of the push-out is especially problematic during continuous mode firing of the EUV system because re-alignment of droplets to the primary focal spot cannot be achieved before the laser fires again and lases a succeeding droplet outside the primary focal spot. Thus, the effect of the push-out is that plasma generated from succeeding droplets is not focused in the primary focal spot of the collector, and, consequently, EUV light output is not optimized.

Current methods to compensate for droplet push-out rely on droplet-to-droplet feedback control of the droplet generator to re-align droplets in the primary focal spot after the push-out has occurred. Such droplet-to-droplet feedback control is not ideal, however, because of the relatively long time necessary to re-align droplets relative to the speed at which the droplets travel. For example, when the laser is firing in a continuous mode, the droplet-to-droplet feedback after plasma from a first droplet causes a push-out disturbance is too slow to completely re-align a next droplet to the primary focal spot target before that next droplet is hit by the laser beam.

What is needed, therefore, is an improved way to accurately re-position the droplets of target material more rapidly so the laser beam strikes the droplets within the focal spot of the laser beam.

SUMMARY

In one embodiment is presented a method of pre-compensating for push-out from a primary focal spot of target material droplets during burst-firing of an extreme ultraviolet laser light source comprising: sensing one or more droplet during a burst, the one or more droplet delivered from a droplet generator to a target position at which the one or more droplet is to be lased; calculating an axial position for each of the one or more sensed droplet in the burst; estimating an open-loop droplet position for each of the one or more droplet in the burst by subtracting droplet-to-droplet feedback for each of the one or more droplet in the burst from the calculated axial position for each of the one or more droplet in the burst; calculating after the burst has ended a pre-compensation correction based on the open loop droplet position from the one or more droplets in the burst; calculating an updated target position with the pre-compensation correction; and commanding one or more actuator to reposition a droplet generator to deliver, during a succeeding burst, droplets of target material to the updated target position.

In another embodiment is presented a system for pre-compensation of push-out from a primary focal spot of target material droplets during burst-firing of an extreme ultraviolet laser light source comprising: a droplet generator; a sensor; one or more axis controller; one or more actuator to position the droplet generator; wherein the sensor senses one or more droplet during a burst, the one or more droplet delivered from the droplet generator to a target position at which the one or more droplet is to be lased; and the one or more axis controller: calculates an axial position of each of the one or more droplet; estimates an open-loop droplet position for each of the one or more sensed droplet in the burst; calculates, after the burst has ended, a pre-compensation correction based on the open-loop droplet position of the one or more droplet in the burst; calculates an updated target position with the pre-compensation correction; and commands one or more actuator to reposition the droplet generator to deliver, during a succeeding burst, droplets of target material to the updated target position.

BRIEF DESCRIPTION OF DRAWINGS

FIG. 3a is a schematic illustrating droplet orientation when the driver laser is off.

DETAILED DESCRIPTION OF THE INVENTION

A semiconductor wafer is divided into multiple dies, each of which is to have the same type of integrated circuit fabricated thereon. Therefore, the dies on the wafer need to be exposed to equivalent amounts of EUV light. To meet this requirement, the laser is fired at the same operation point for every exposure. Thus, the generated push-outs are similar in size. Although the push-outs have a repetitive character in a single operation point, the size of the push-outs can differ across operating points and across EUV systems.

Embodiments of a system and method described herein make use of this repetitive character of the push-outs to adaptively pre-compensate for droplet push-out by learning how big the droplet push-out is and adjusting a droplet generator between bursts in anticipation of the push-out. Specifically, the EUV system repositions the droplet generator to deliver droplets in a succeeding burst to a target position that is offset from the primary focal spot based on the magnitude of the push-out observed in the previous burst. As a droplet (delivered by the repositioned droplet generator) is hit by the laser beam, a ramp-up of the push-out of that droplet begins, thereby driving the droplet into the primary focal spot to generate plasma that is, in turn, focused by an elliptical collector onto an intermediate focus before being passed to or used by, e.g., a lithography system. Over time, the EUV system learns to maintain droplet position on-target. This adaptive nature of the pre-compensation is important in order to avoid long calibration procedures for a static target adaptation.

Figure 1:
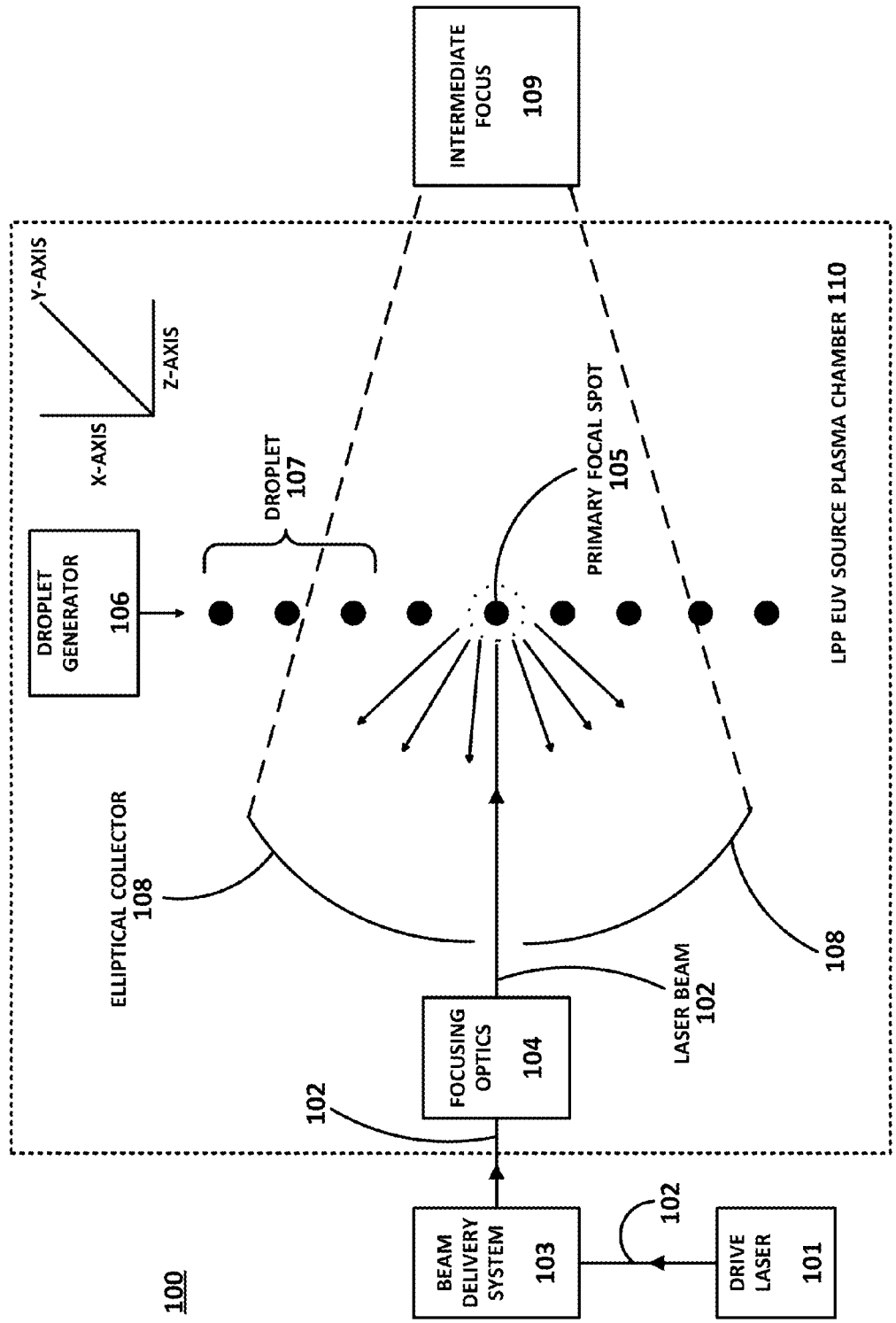
FIG. 1 is a schematic illustrating some of the components of a typical LPP EUV system.

FIG. 1 illustrates some of the components of a typical LPP EUV system 100. A drive laser 101, such as a $CO_2$ laser, produces a laser beam 102 that passes through a beam delivery system 103 and through focusing optics 104. Focusing optics 104 have a primary focal spot 105 at an irradiation site within an LPP EUV source plasma chamber 110. A droplet generator 106 produces and ejects droplets 107 of an appropriate target material that, when hit by laser beam 102 at the irradiation site, produce plasma that emits EUV light. An elliptical collector 108 focuses the EUV light from the plasma at an intermediate focus 109 for delivering the produced EUV light to, e.g., a lithography system. Intermediate focus 109 will typically be within a scanner (not shown) containing boats of wafers that are to be exposed to the EUV light, with a portion of the boat containing wafers currently being irradiated being located at intermediate focus 109. In some embodiments, there may be multiple drive lasers 101, with beams that all converge on focusing optics 104. One type of LPP EUV light source may use a $CO_2$ laser and a zinc selenide (ZnSe) lens with an anti-reflective coating and a clear aperture of about 6 to 8 inches.

Drive laser 101 is fired in a pulsating manner in order to hit discrete droplets 107 separately. Although every sequence of pulses comprises a burst, drive laser 101 can be fired in different burst modes. In a stroboscopic mode (i.e., a mode with short bursts), the length of the bursts are limited to 1 ms, whereas in a continuous mode (i.e., a mode with long bursts), the expected burst length is 3-4 seconds for each die.

When firing drive laser 101 in stroboscopic mode, EUV system 100 maintains droplets 107 on-target reasonably well using closed-loop (droplet-to-droplet) feedback. To achieve higher EUV light power output, however, drive laser 101 is more often run in the continuous mode (long bursts) in which plasma is created during longer intervals of time. During these longer continuous bursts of firing, droplets 107 interact with the plasma and, as a result, are pushed out away from primary focal spot 105. This displacement, or "push-out", negatively impacts EUV light production because the plasma generated is no longer concentrated within the primary focal spot so maximal EUV light cannot be collected by elliptical collector 108 and refocused for downstream use.

A closed-loop (droplet-to-droplet) feedback control system ("droplet-to-droplet feedback system") has been used historically to keep droplets 107 targeted on primary focal spot 105 during pulse firing of drive laser 101. The droplet-to-droplet feedback system comprises a line laser in combination with a sensor (e.g., a narrow field (NF) camera) that measures droplet position along the y- and/or z-axis as droplet 107 is about to be lased. EUV system 100 uses the measured droplet position to command actuators (e.g., piezoelectric ("PZT") actuators) to re-align droplet generator 106 so that successive droplets (pushed out of primary focal spot 105 by plasma generated from preceding droplets 107) are re-aligned to be delivered to primary focal spot 105. One disadvantage of this droplet-to-droplet feedback system is that it operates without taking into consideration repeated errors in position across bursts (i.e., inter-burst target errors), which limits the actuators that can be used to re-align droplets on-target. Specifically, because coarse movement actuators (e.g., stepper motors) introduce into the EUV system vibration which will push droplets 107 further off-target, coarse movement actuators are non-preferred for re-aligning droplets 107 on-target. Using only fine movement actuators (e.g., PZT actuators) avoids the introduction of vibration, but limits how rapidly droplets can be re-aligned to target as well as the range over which droplets can be repositioned. Consequently, the closed-loop (droplet-to-droplet) feedback system takes longer to correct a push-out disturbance (e.g., approximately 0.4 ms) than is desirable.

Figure 2:
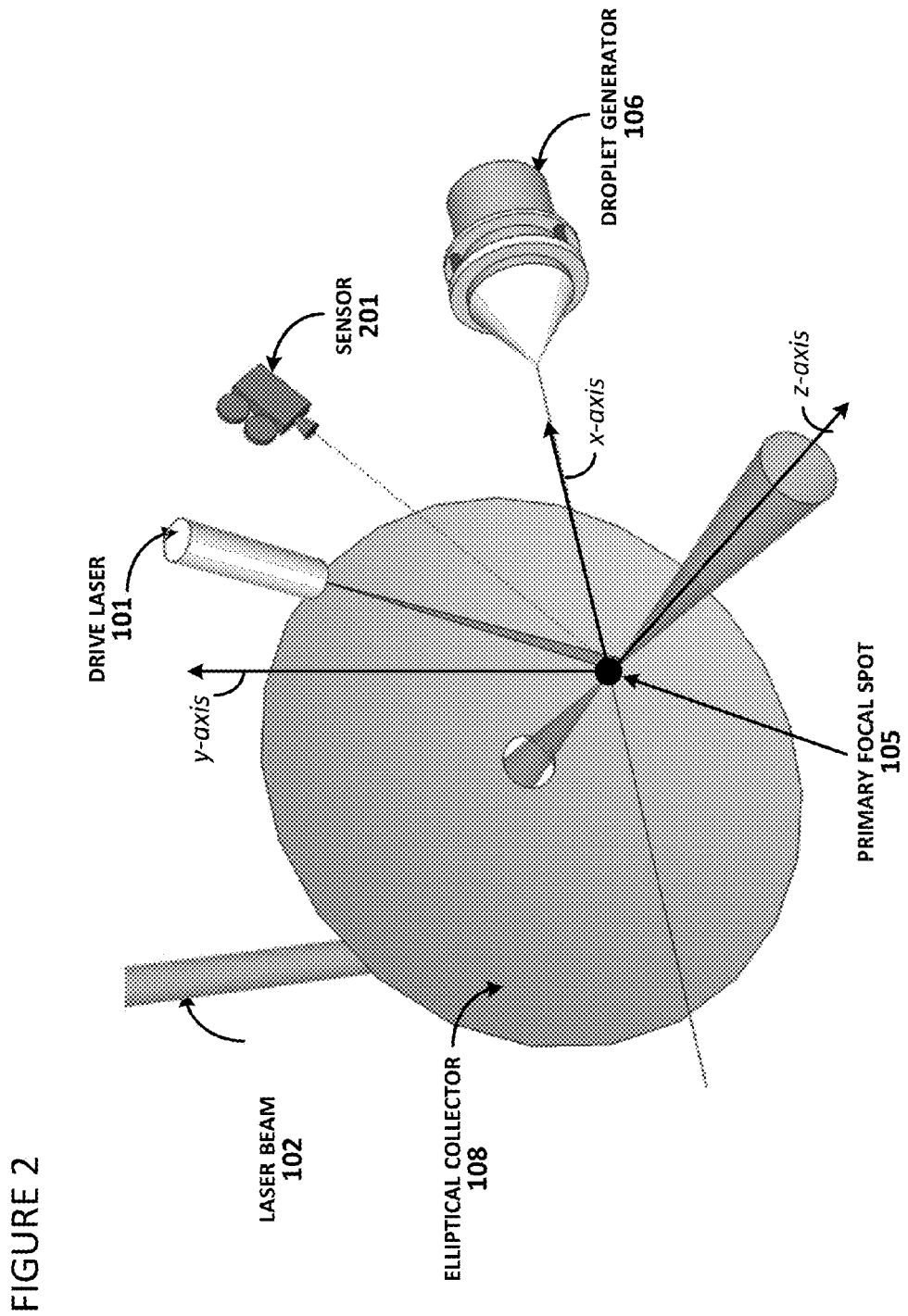
FIG. 2 is a diagram depicting EUV system components involved in optimization of EUV light production according to one embodiment.

A magnified schematic of EUV system components involved in optimization of EUV light production according to one embodiment is shown in FIG. 2. Laser beam 102 is delivered through elliptical collector 108 to primary focal spot 105. Positioning of primary focal spot 105 along the y- and z-axes is determined by focusing optics 104, to wit, a final focus lens (not shown) and a final focus steering mirror (not shown), as described in U.S. patent application Ser. No. 13/549,261 (Frihauf et al.), hereby incorporated by reference in its entirety herein. Energy output from the LPP EUV system varies based on how well laser beam 102 can be focused and can maintain focus over time on droplets 107 generated by droplet generator 106. Optimal energy is output from EUV system 100 if the droplets are positioned in primary focal spot 105 when hit by laser beam 102. Such positioning of the droplets allows elliptical collector 108 to collect a maximum amount of EUV light from the generated plasma for delivery to, e.g., a lithography system. A sensor 201 (e.g., narrow field (NF) camera) senses the droplets as they pass through a laser curtain during travel to primary focal spot 105 and provides droplet-to-droplet feedback to EUV system 100, which droplet-to-droplet feedback is used to adjust droplet generator 106 to re-align droplets 107 to primary focal spot 105 (i.e., "on-target").

How droplet position along the z-axis changes during laser firing in a continuous burst mode will now be described with reference to FIGS. 3a, 3b, 3c, 3d, and 4. FIGS. 3a, 3b, 3c, and 3d illustrate schematically the orientation of droplets 107, respectively, before, at initiation of, during, and after laser burst firing in a continuous burst mode. FIG. 4 is a graph depicting droplet position along the z-axis over time with primary focal spot 105 indicated by a solid line at a z-axis position of 0. Droplets 107 lased while at primary focal spot 105 generate plasma within the focal spot of elliptical collector 108. Arrows 401a, 401b, 401c, and 401d indicate points in time that FIGS. 3a, 3b, 3c, and 3d, respectively, occur.

Referring first to FIG. 3a, before drive laser 101 is fired, droplets 107 ejected from droplet generator 106 to droplet catcher 301 are oriented in a straight line along the x-axis of primary focal spot 105. At the point in time shown by arrow 401a in FIG. 4, droplets 107 pass through primary focal spot 105.

Figure 3B:
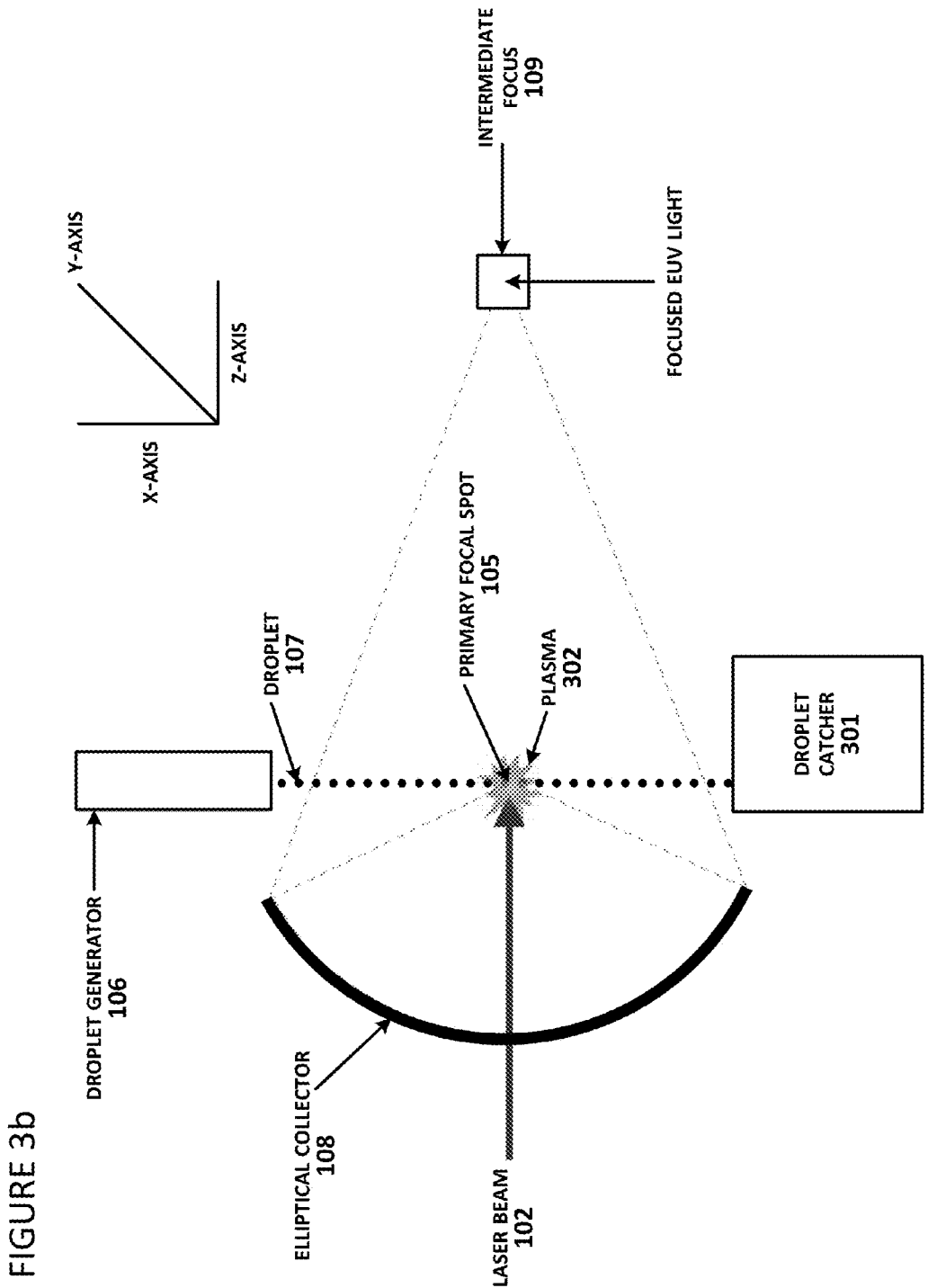
FIG. 3b is a schematic illustrating droplet orientation when the drive laser is first pulsed.
Figure 4:
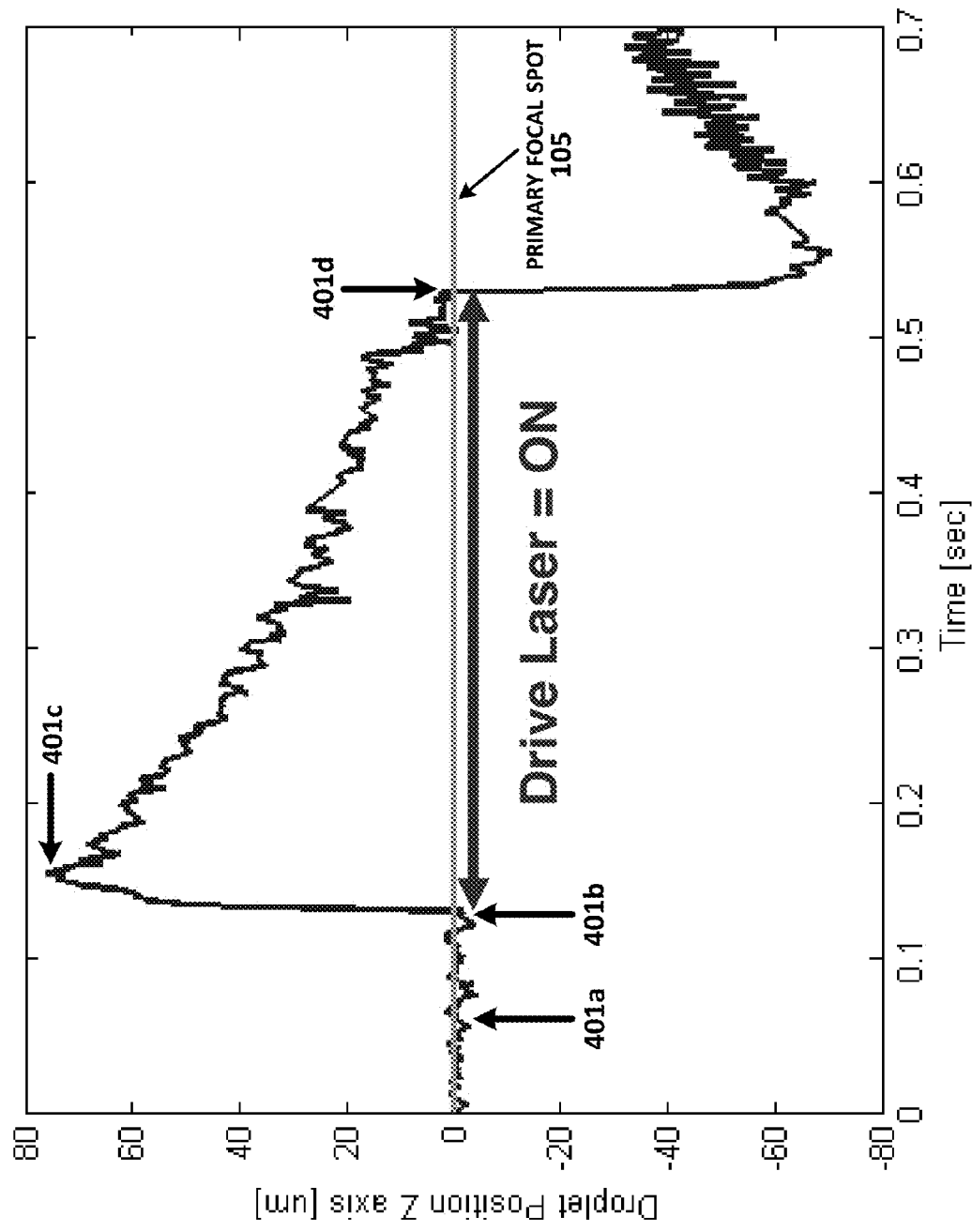
FIG. 4 depicts droplet position along the z-axis as a function of time before, during, and after laser firing.

Referring now to FIG. 3b, as the pulse of laser beam 102 hits a first droplet 107 at primary focal spot 105, the target material of first droplet 107 is vaporized and a plasma 302 is generated at primary focal spot 105. EUV light emitted from plasma 302 is collected by elliptical collector 108 and reflected onto intermediate focus 109 where it passes into or is used by, e.g., a lithography system. At the point in time shown by arrow 401b in FIG. 4, droplet 107 is at primary focal spot 105.

Figure 3C:
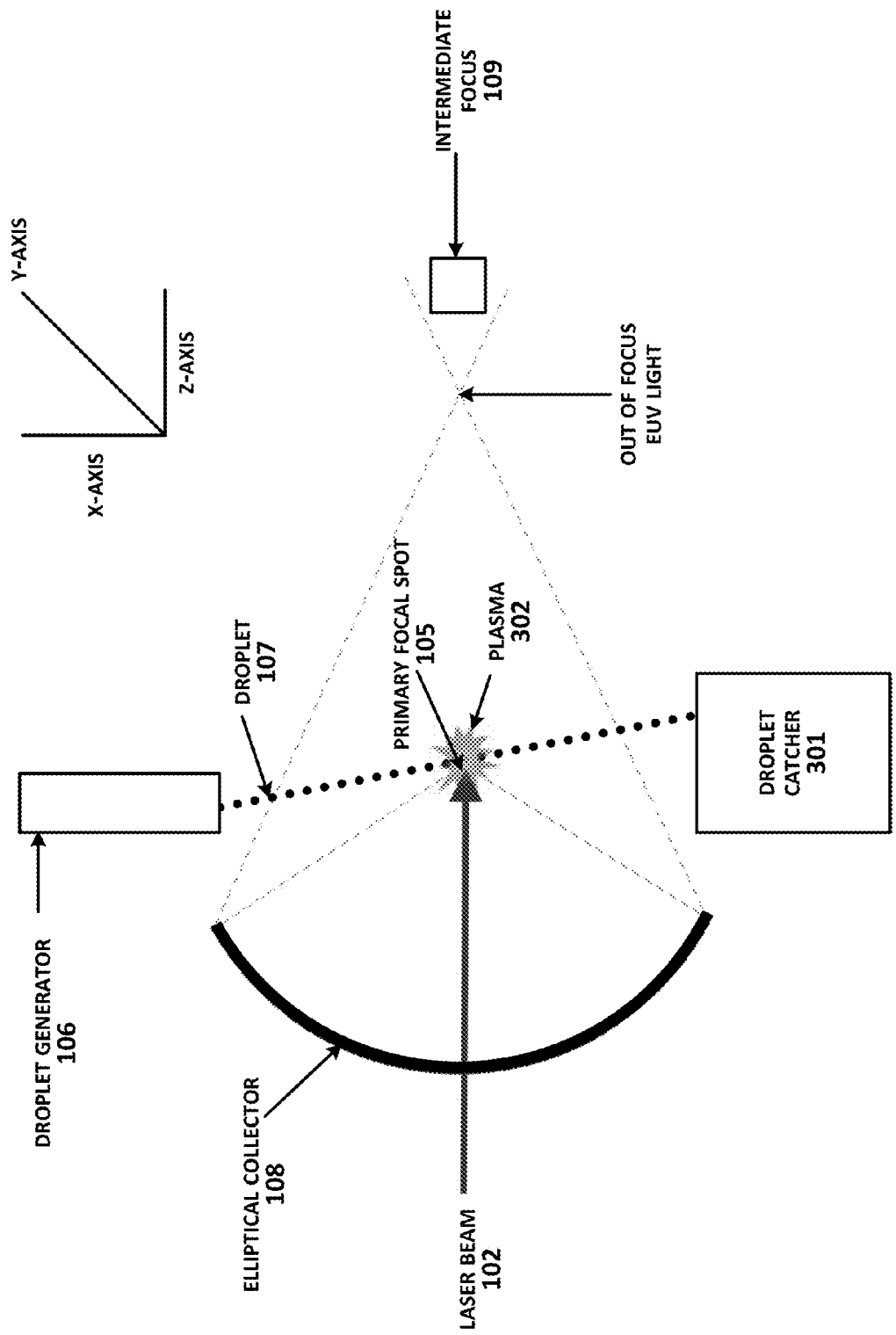
FIG. 3c is a schematic illustrating a push-out of droplets along the z-axis observed when the drive laser is pulsed in a continuous mode.

Referring now to FIG. 3c, as plasma 302 is formed by irradiation of droplet 107, surrounding droplets 107 are displaced ("pushed out") from primary focal spot 105 of elliptical collector 108. Thus, as laser beam 102 strikes a first droplet 107, succeeding droplet 107 is pushed out along the z-axis from the z-axis coordinate of primary focal spot 105. At the point in time shown by arrow 401c in FIG. 4, droplet 107 is displaced (approximately 75 µm in this example) from primary focal spot 105. Because of this push-out, plasma 302 is no longer produced at primary focal spot 105 and thus, produced EUV light is not focused by elliptical collector 108 at intermediate focus 109 (i.e., the produced EUV light is out of focus). If the push-out phenomenon is uncontrolled, plasma 302 generated from irradiation of additional successive droplets 107 can trigger additive z-axis push-out of successive droplets 107. Consequently, EUV production is significantly disturbed—enough to ruin a die on a wafer during exposure—especially when drive laser 101 is fired in continuous mode. Although firing drive laser 101 at a fixed operation point generates push-outs of similar sizes, the push-outs drift as drive laser 101 is fired for longer time periods.

Figure 3D:
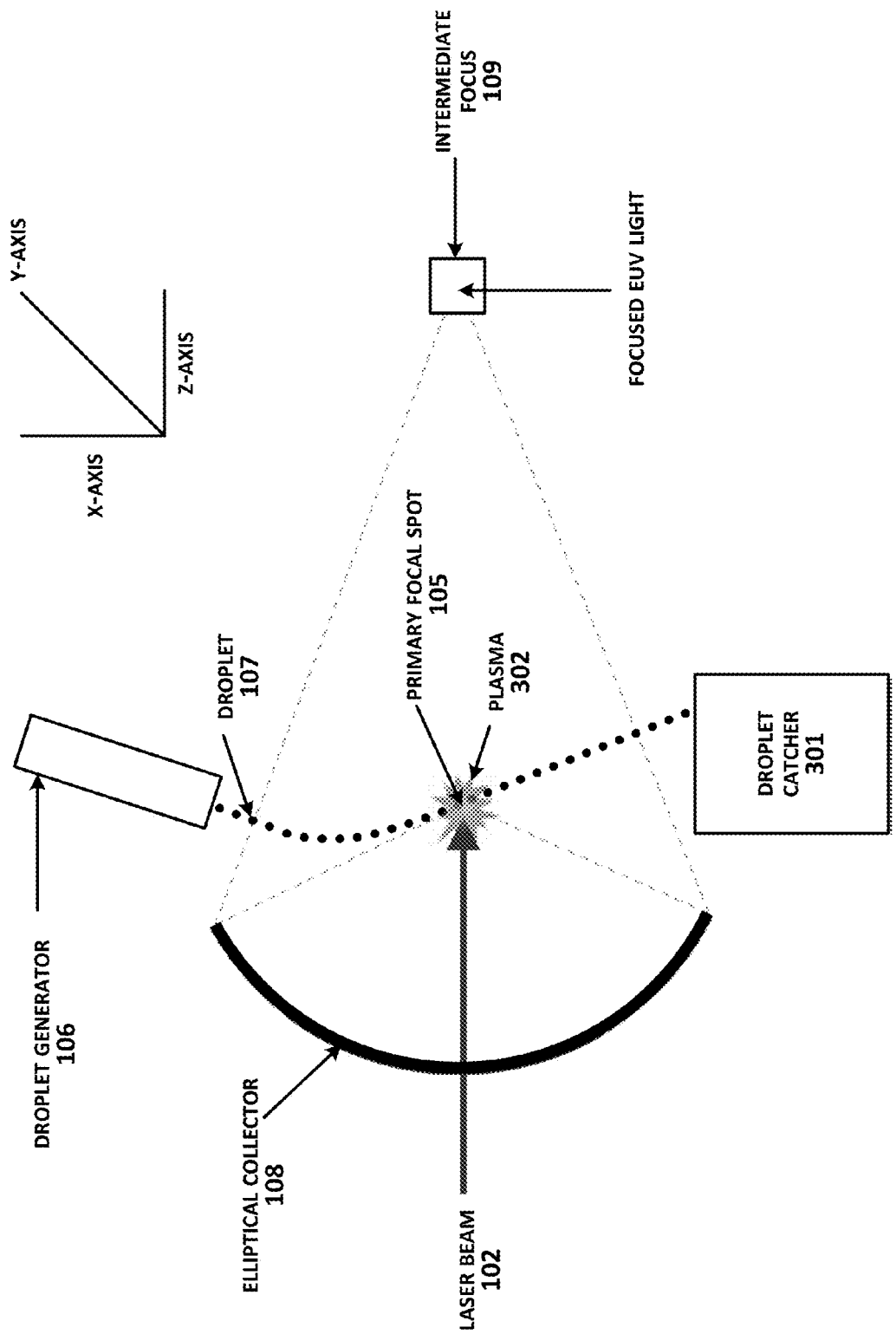
FIG. 3d is a schematic illustrating droplet-to-droplet feedback-controlled re-alignment of droplets to compensate for the push-out observed when the drive laser is pulsed in a continuous mode.

Referring now to FIG. 3d, droplet push-out has been controlled historically through a droplet-to-droplet feedback system which adjusts droplet generator 106 after push-out has occurred to start moving succeeding droplets 107 back to primary focal spot 105. In essence, the droplet-to-droplet feedback system waits for the push-out, and then fights the disturbance by adjusting droplet generator 106 with actuators (e.g., PZT actuators) to re-align successive droplets 107 to target (i.e., primary focal spot 105). Because the droplet-to-droplet feedback process does not begin until after push-out has occurred, however, error between an actual position of droplet 107 and primary focal spot 105 can be very large. Ideally, 10 ms after burst firing begins, droplets 107 should be (and should stay) within ±5 µm of primary focal spot 105. As a result, as shown in FIG. 4, the droplet-to-droplet feedback process requires substantial time (e.g., approximately 0.4 seconds) after the start of a burst to reposition droplets 107 back on-target. Once droplet-to-droplet feedback processes have re-aligned droplets 107 to primary focal spot 105 (as shown by arrow 4d), droplet-to-droplet feedback control signals can hold droplets 107 near primary focal spot 105 for the duration of the burst.

In contrast to current droplet-to-droplet feedback systems, the embodiments discussed herein take advantage between bursts of the push-out disturbance and thereby reduce the time necessary for droplet-to-droplet feedback systems to re-align droplets during a burst to a correct z-axis position to overcome the push-out disturbance. Minimizing the droplet-to-droplet feedback also allows EUV system 100 to rely on PZT actuators to reposition droplets 107 and to avoid having to use stepper motors (which introduce vibration into the EUV system and thereby interfere with successful repositioning of droplet 107 on-target).

Figure 5:
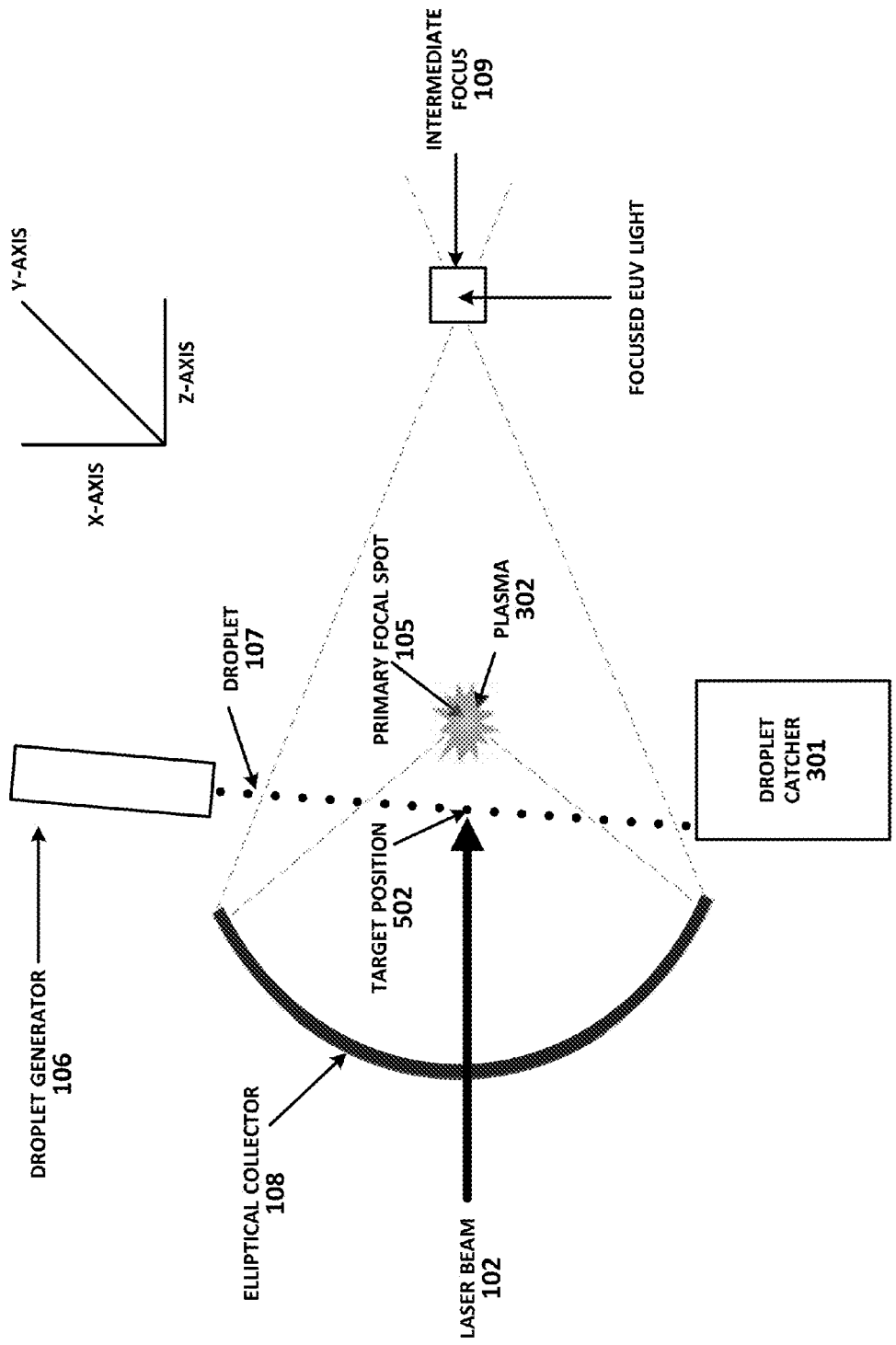
FIG. 5 is a schematic illustrating adaptive pre-compensation for droplet push-out along the z-axis.

Referring now to FIG. 5, in contrast to known systems and methods of producing EUV light, embodiments of the system and method described herein re-align droplets during the inter-burst interval (i.e., between bursts) to a target position 502 which is displaced away from primary focal spot 105 such that laser beam 102 strikes droplet 107 at target position 502. As laser beam 102 strikes droplet 107 at target position 502, droplet 107 is pushed-out, but the push-out phenomenon pushes droplet 107 into (rather than out of) primary focal spot 105 as plasma 302 is generated. Thus plasma 302 is generated at primary focal spot 105— that is, in the focal spot of elliptical collector 108—and produced EUV light is collected and focused by elliptical collector 108 at intermediate focus 109. One of skill in the art will recognize that, for a first firing burst in a continuous mode of operation, target position 502 can, but need not coincide with primary focal spot 105.

Figure 6:
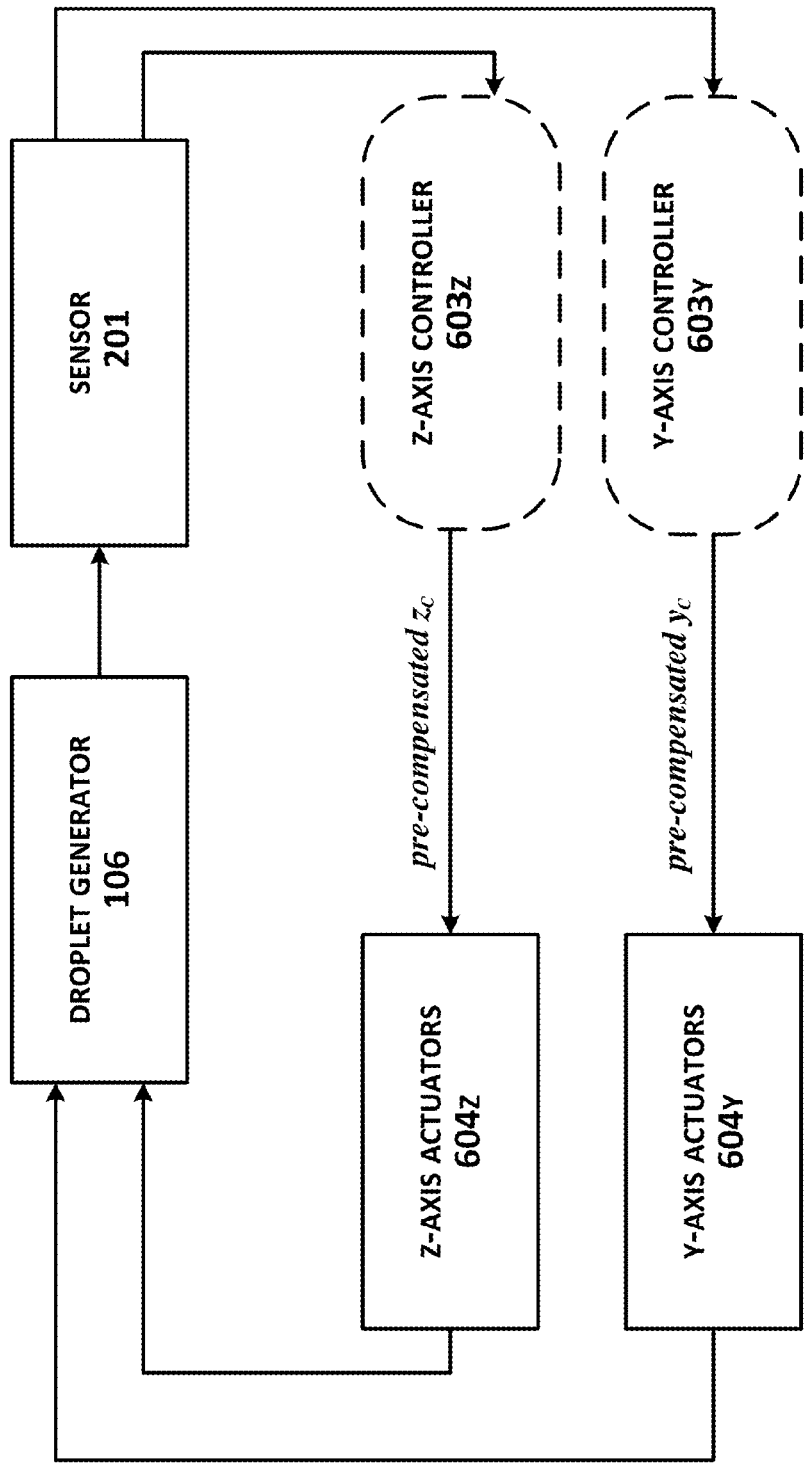
FIG. 6 is a block diagram depicting EUV system components involved in adaptive pre-compensation for droplet push-out according to one embodiment.

A block diagram providing an overview of a pre-compensation control loop used to adaptively adjust droplet target position according to one embodiment is presented in FIG. 6. Droplet generator 106 ejects droplets 107 along an x-axis to a target (x-, y-, z-) position at which droplets 107 are to be lased as discussed with respect to FIG. 1. One or more sensor 201 inside LPP EUV source chamber 110 senses one or more axial position (e.g., along a y-axis, along a z-axis, or along both axes) of ejected droplet 107. The sensed axial position of droplet 107 along the y-axis is passed to y-axis controller 603Y and/or the sensed position of droplet 107 along the z-axis is passed to z-axis controller 603Z. Axial controllers 603Y and/or 603Z determine(s) an updated target position for droplet 107 that pre-compensates for anticipated droplet push-out (as discussed in greater detail elsewhere herein). Axial controllers 603Y and/or 603Z then output(s) commands to, respectively, y-axis actuators 604y and/or z-axis actuators 604z (e.g., stepper motors and/or PZTs) to adjust droplet generator 106 such that succeeding droplets 107 are delivered to the pre-compensated axial target position 502.

In another embodiment, a pre-compensation control loop is used to adaptively adjust droplet position. In this embodiment, axial controllers 603Y and/or 603Z determine(s) an updated droplet position for droplet 107 that pre-compensates for anticipated droplet push-out (as discussed in greater detail elsewhere herein). Axial controllers 603Y and/or 603Z then output(s) commands to, respectively, y-axis actuators 604y and/or z-axis actuators 604z (e.g., stepper motors and/or PZTs) to adjust droplet generator 106 such that succeeding droplets 107 are delivered to the pre-compensated axial droplet position.

Figure 7:
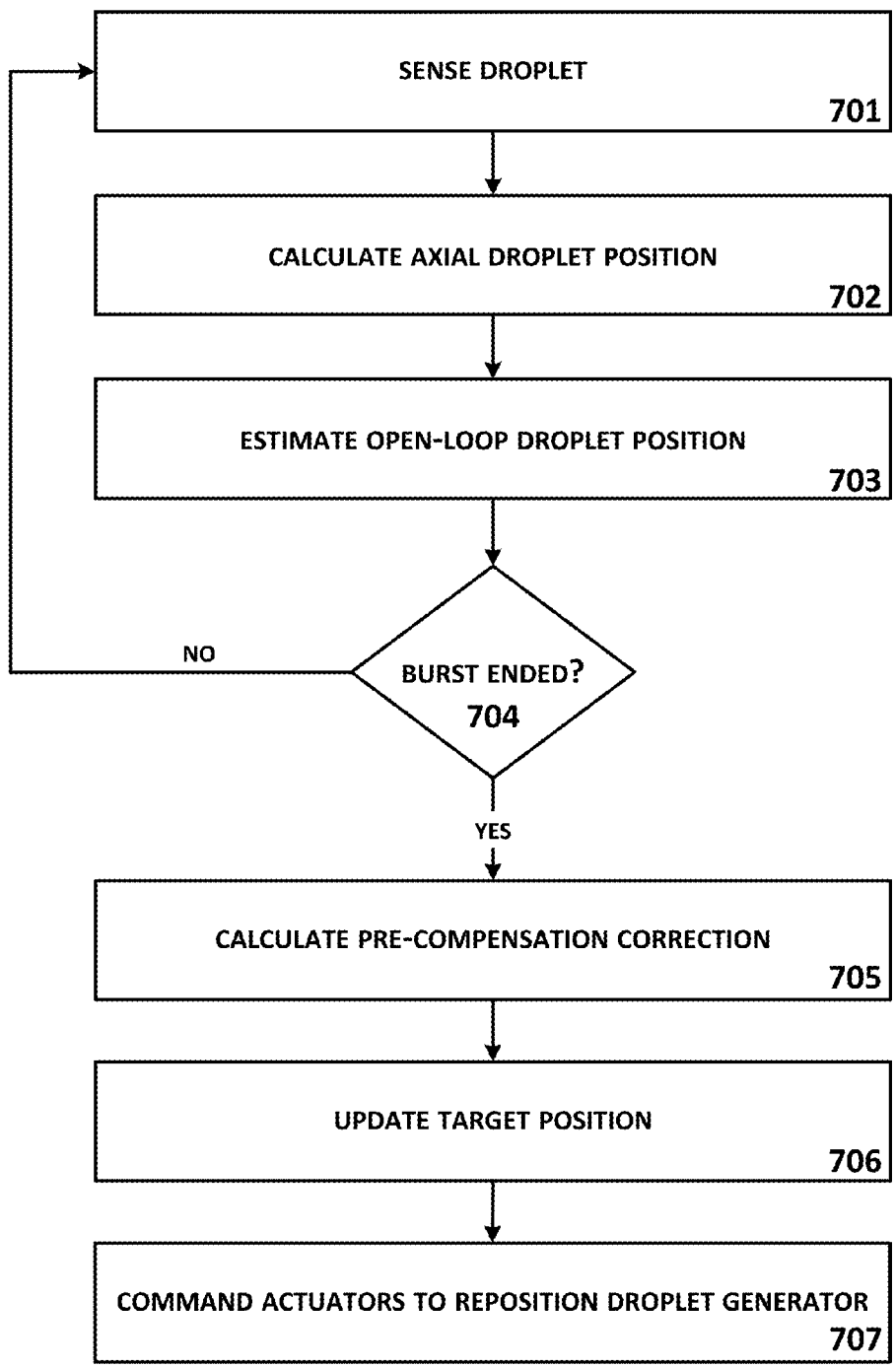
FIG. 7 is a flowchart of a method to compensate for droplet push-out according to one embodiment.

Referring now to FIG. 7, a flowchart of one embodiment of a method for adaptively adjusting droplet target position to pre-compensate for droplet push-out is presented. During closed-loop laser operation (i.e., during a burst), the magnitude of the push-out disturbance cannot be measured directly. Instead, to effectively pre-compensate for droplet push-out, EUV system 100 measures the position of a droplet just before the droplet is lased and estimates the magnitude of the push-out. Thus, in step 701, as droplet 107 passes through a laser curtain on its way to target position 502, sensor 201 (e.g., an NF camera) senses droplet 107 and sends data about droplet 107 to axial controllers 603Y and/or 603Z. In one embodiment, sensing of droplet position is triggered by a start of a burst and is terminated by cessation of the burst. The field of view of sensor 201 determines sampling frequency (e.g., reducing the field of view of sensor 201 allows for an increased frame rate) of droplets.

In step 702, a position of the sensed droplet along the y- and/or z-axis is calculated. To do this, sensor 201 measures an axial position of droplet 107 (in pixels) and determines a vertical centroid and a horizontal centroid for droplet 107. Axial controllers then perform coordinate transformations on the vertical and horizontal centroids. Thus, y-axis controller 603Y converts the pixels of the vertical centroid to calculate a y-axis position (e.g., in μm), and z-axis controller 603Z converts the pixels of the horizontal centroid to calculate a z-axis position (e.g., in μm) of droplet 107. This transformation minimizes any effect of sensor tilt on the measured (y,z) position of droplet 107.

In step 703, the axial controllers estimate axial (z- or y-) open-loop positions of sensed droplet 107. Conceptually, the axial open-loop positions are the z- and/or y-position(s) of droplet 107 if no droplet-to-droplet feedback had been applied to reposition droplet 107—that is, the droplet push-out along the (z- and/or y-axes) without droplet-to-droplet feedback control to re-align droplets 107 to primary focal spot 105. The axis controllers estimate the axial open-loop estimates by subtracting any droplet-to-droplet feedback adjustment from the determined droplet y- and/or z-position(s). Thus, y-axis controller 603Y subtracts the droplet-to-droplet feedback adjustment applied to compensate for y-axis push-out of droplet 107 from the y-axis position determined in step 702 to calculate an estimated open-loop y-axis position of sensed droplet 107. Similarly, the z-axis controller 603Z subtracts the droplet-to-droplet feedback adjustment applied to compensate for z-axis push-out of droplet 107 from the z-axis position determined in step 702 to calculate an estimated open-loop z-axis position of sensed droplet 107.

In step 704, the axis controllers determine whether the burst has ended. If the burst has not ended, the process returns to step 701 and steps 701, 702, 703, and 704 are performed for another droplet 107. That is, steps 701, 702, 703, and 704 are iterated for the droplets lased during a burst.

If the burst has ended, then in step 705, the axis controllers calculate a pre-compensation correction to be applied to determine a new target position.

Mathematically, the pre-compensation correction is $$K*(OL_{avg}-T_b)$$

where K is a learning gain, $OL_{avg}$ is an average of the estimated open-loop axial position data calculated in steps 703 for the previous burst, and $T_b$ is the axial position of primary focal spot 105. The pre-compensation correction should be in the opposite direction to the calculated $OL_{avg}$. The number of data points used to calculate the $OL_{avg}$ depends on the frame/second speed of sensor 201 when sensing droplet 107 and on the length of time over which the burst occurred. In one embodiment, because sensor speed is not always consistent and sensor 201 may not always capture a good image, position data are iterated to fill in gaps between data frame and make a "continuous" signal before data sampling at a predetermined frequency.

Thus, y-axis controller 603Y calculates a pre-compensation correction by determining the deviation of the averaged estimated open-loop y-axis position of sensed droplet 107 in the previous burst from the y-axis position of the primary focal spot, and multiplying that y-axis deviation by a learning gain. Similarly, z-axis controller 603Z calculates a pre-compensation correction by determining the deviation of the averaged estimated open-loop z-axis position of sensed droplet 107 in the previous burst from the z-axis position of the primary focal spot, and multiplying that z-axis deviation by a learning gain (which may be the same learning gain as that used to calculate the y-axis pre-compensation correction).

The learning gain is a tunable parameter that can range between 0 and 1, but is preferably about 0.1 or less. Determination of the learning gain necessitates a trade-off between rapid convergence on-target and susceptibility to variable push-out disturbances.

A large learning gain (e.g., K=1), for instance, works well for a first iteration of the adaptive loop because, during the first burst, there is no previous information from which the system can learn. Or, if the open-loop displacement is actually known (rather than being estimated), then a learning gain of 1.0 is acceptable because the known magnitude of the droplet push-out would indicate how far to offset target position 502 from primary focal spot 105. If, however, the learning gain remains set to 1.0, the updated target position continues to rely almost completely on the position of the droplets during the immediately preceding burst—which may not always be correct. For instance, if the push-out during a first burst is quite large for some reason, most of the change in target positioning determined from the open-loop average position of that burst if the learning gain is 1.0. The result will be that the target position 502 will be displaced a considerable distance away from primary focal spot 105.

If the push-out for a second (succeeding) burst is small, however, the droplets will have been displaced too far away from primary focal spot 105 so will not be in a correct target position to be pushed into focal spot 105 and less plasma will be produced. Once again, however, the system will over-rely on this previous position when calculating a new target position after the second burst and, consequently, determine that the target position should be adjusted only by a small amount. This process will keep the target position bouncing back and forth between extreme target positions (e.g., small displacement from primary focal spot 105→large displacement from primary focal spot 105→small displacement from primary focal spot 105, etc.) leading to poor EUV output and instability.

A smaller learning gain (e.g., K=0.1), on the other hand, is preferable when the open-loop displacement is estimated (rather than actually measured) so as to avoid an over-reliance on the estimated open-loop displacement when determining the target position. With the lower learning gain, the adaptive pre-compensation loop "learns" over time to achieve a stable target position 502. If, however, a very small learning gain is chosen (e.g., K=0.1), target position 502 will barely change in response to data gathered from previous bursts and the system will take longer to learn an acceptable stable displacement from primary focal spot 105.

Ideally, then, a learning gain that changes over time is preferred. For example, a large learning gain that decreases over time allows the pre-compensation to converge quickly to a "best" target position that is stable and relatively insensitive to fluctuations in droplet position over time.

In step 706, the axis controllers update target position 502 by adding the pre-compensation corrections calculated in step 705 to target position 502 of the previous burst to obtain an updated pre-compensated target. Mathematically, $$T_{i+1} = T_i - K^*(OL_{avg} - T_b)$$

where $T_i$ is the pre-compensated target of the previous burst and $T_{i+1}$ is the updated pre-compensated target. Thus, y-axis controller 603Y calculates an updated pre-compensated target along the y-axis and z-axis controller 603Z calculates an updated pre-compensation target along the z-axis. Importantly, this updated pre-compensation target is not primary focal spot 105, but is a learned displacement that allows the push-out phenomenon to push the droplets back into primary focal spot 105 when a next burst begins. One of skill in the art will recognize that other learning algorithms (e.g., Least Mean Squared or Recursive Least Squares equations) can be used to update the pre-compensated target.

Pre-compensation based upon the previous burst alone may be susceptible to measurement noise. Thus, in one embodiment, data obtained from some or all previous bursts are used to calculate the pre-compensation correction before using that pre-compensation correction to update the pre-compensated target.

In step 707, the axis controllers command axial actuators to reposition droplet generator 106 so that droplets 107 ejected from droplet generator 106 are in the updated pre-compensated target position when lased. Thus, y-axis controller 603Y sends a command to y-axis actuators controlling movement of droplet generator along the y-axis and/or z-axis controller 603Z sends a command to a z-axis actuators controlling movement of droplet generator along the z-axis such that droplets 107 ejected from droplet generator 106 are lased as they pass through the updated (that is, pre-compensated) (y,z) target. When lased, droplets 107 are pushed out of target position 502 and into primary focal spot 105 where light from generated plasma 302 is collected by elliptical mirror 108 and focused onto intermediate focus 109. Thus, the ramp-up of the push-out itself, rather than active steering, moves droplet 107 to primary focal spot 105, and can therefore limit how rapidly droplets can be moved on target.

In one embodiment, calculation of the pre-compensation correction (step 705), updating of the target position 502 (step 706), and commanding the axial actuators (step 707) occur during the inter-burst interval.

In one embodiment, some accommodations are implemented during bursts to mitigate undesired effects on the pre-compensated target adaptation. For instance, after target adjustment, ramping (i.e., ramp-up and ramp-down) of the push-out phenomenon should be allowed to continue without droplet-to-droplet feedback control. Instead, the push-out should reach the target by itself without any control action because laser beam 102 will push droplets into primary focal spot 105. So, during these ramping periods, the droplet-to-droplet feedback system is made inoperative. One way to achieve this inoperability is to set error in droplet positioning to zero so that no droplet-to-droplet feedback action is initiated during the ramping periods.

Making droplet-to-droplet feedback inoperable during ramping can impact functionality of the open-loop droplet position estimate on which the target adaptation is based. Typically, the learning gain is set to 0.01, which means that the open-loop droplet position estimate relies almost exclusively on the applied droplet-to-droplet feedback to estimate the actual position of the droplet. The result of this reliance is that when the droplet-to-droplet feedback system remains inoperable and the droplet position changes quickly due to the push-out, the open-loop droplet position estimate is far from the actual droplet position. Therefore, the learning gain is set to 1 during the inoperability period, thereby making the open-loop droplet position estimate fully dependent on the position measurement.

Figure 8:
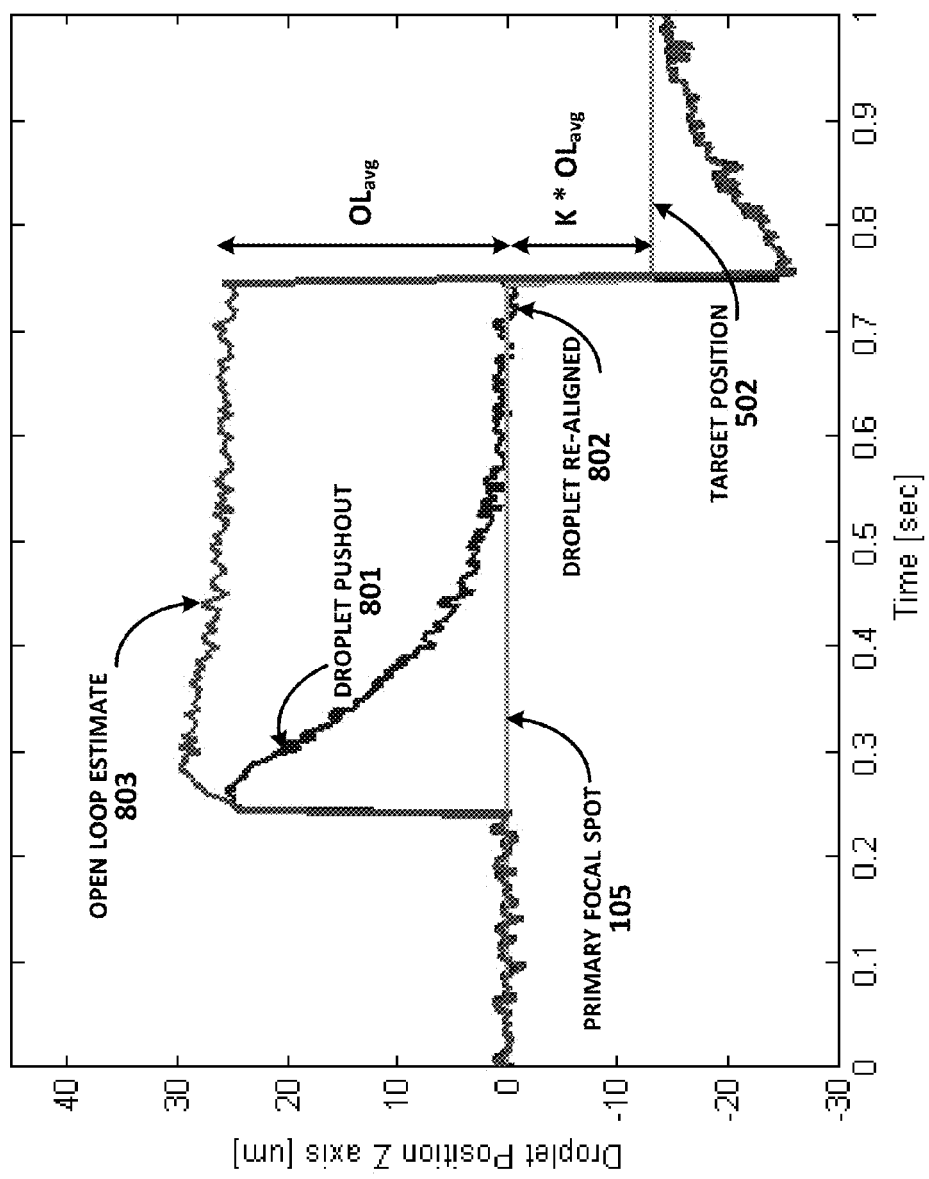
FIG. 8 illustrates droplet position over time during a laser-firing burst with and without droplet-to-droplet feedback to re-align droplets to a primary focal spot according to one embodiment.

The process of FIG. 6 is depicted graphically with exemplar data in FIG. 8 which illustrates droplet position over time during a laser-firing burst with and without closed-loop (droplet-to-droplet) feedback. As seen in the figure, droplets targeted to primary focal spot 105 undergo a push-out 801 along the z-axis away from primary focal spot 105 during the burst, and are eventually re-aligned 802 to primary focal spot 105 (through droplet-to-droplet feedback control as discussed elsewhere herein). An open-loop estimate 803 is determined for droplets 107. Once the burst has ended, an average of the open-loop estimates ($OL_{avg}$) is calculated and then multiplied by a learning gain (K) to obtain a pre-compensation correction. The pre-compensated correction is then added to the previous target position (primary focal spot 105 in this example) to obtain an updated target position 502). Re-alignment of droplet generator 106 to deliver droplets 107 to target position 502 pre-compensates for potential z-axis displacement of droplets 107 by positioning the droplets to be pushed into primary focal spot 105 when lased (so as to thereby optimize generated plasma).

As the method of FIG. 7 is repeated for subsequent bursts, the axis controllers slowly learn how much droplet-to-droplet feedback, on average, is needed to re-align droplets 107 to be on-target. Briefly, after target position 502 is adjusted to pre-compensate for the push-out disturbance in a first burst, the push-out disturbance for the succeeding (second) burst is reduced. After target position 502 is adjusted to pre-compensate for the push-out disturbance in the second burst, the push-out disturbance for the succeeding (third) burst is further reduced, and so on. This learned pre-compensation is illustrated with simulated data in FIGS. 9 and 10.

Figure 9:
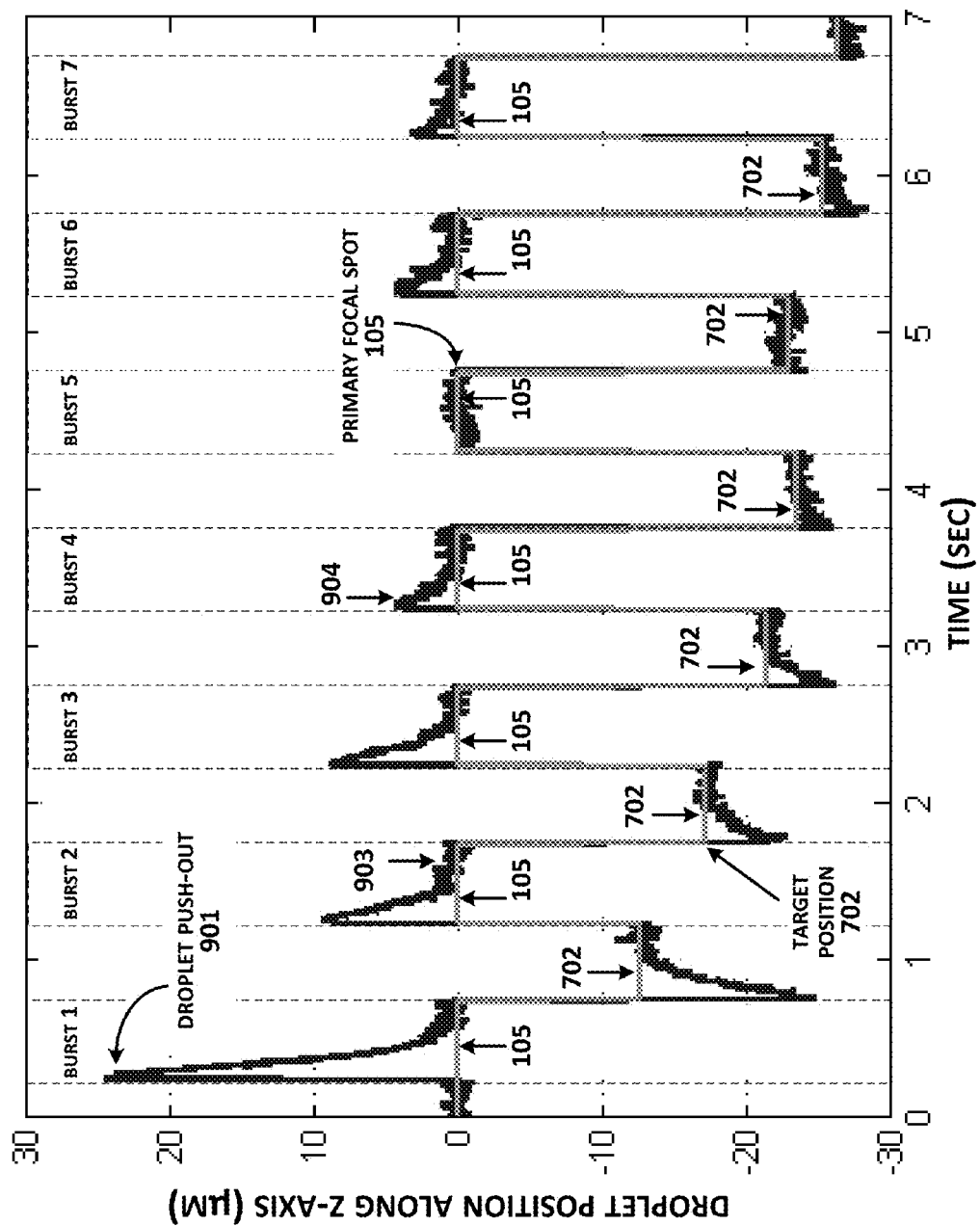
FIG. 9 shows droplet position over time for simulated data during adaptive learning to pre-compensate for droplet push-out according to one embodiment.
Figure 10:
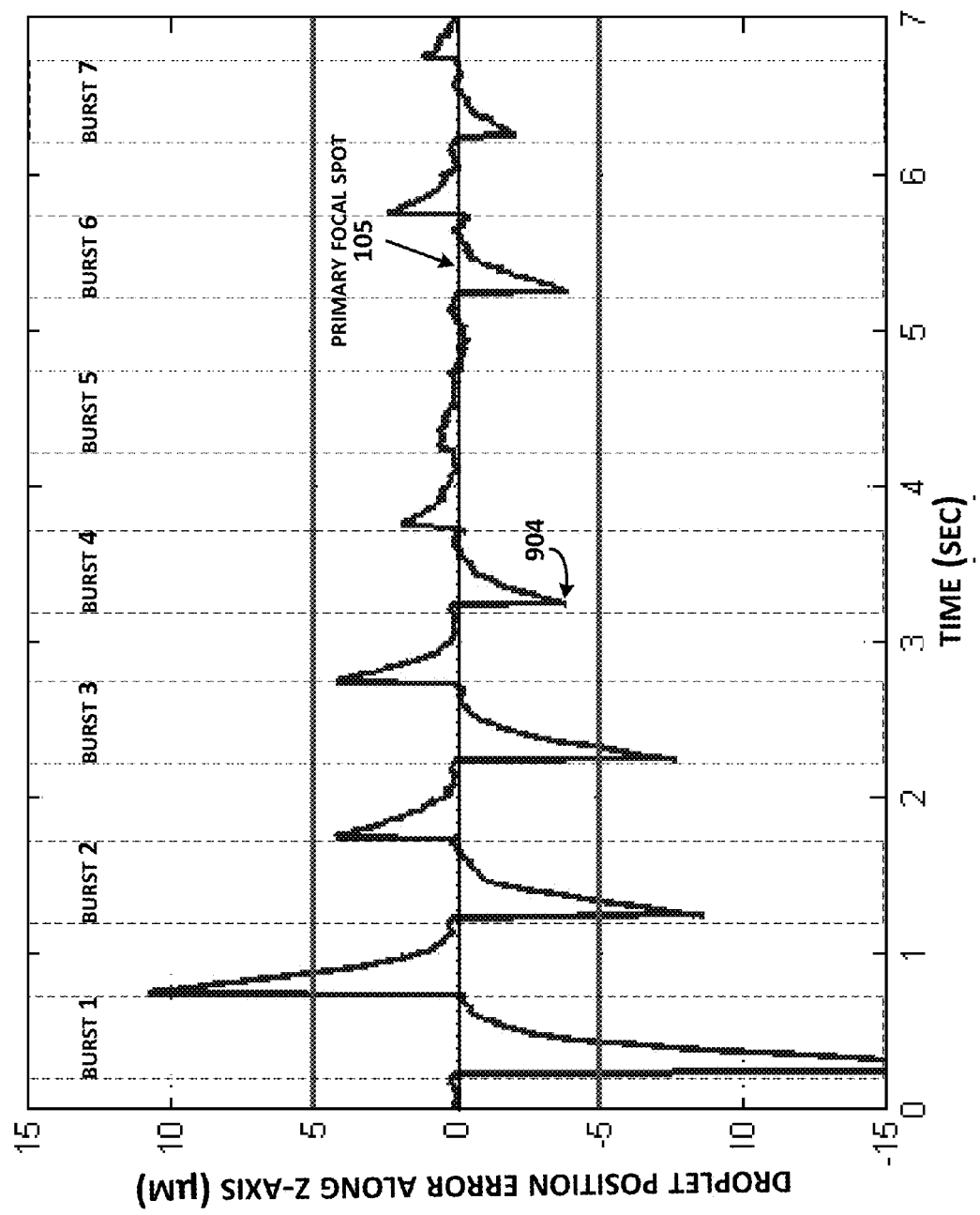
FIG. 10 shows droplet position error over time for simulated data during adaptive learning to pre-compensate for droplet push-out according to one embodiment.

FIG. 9 illustrates convergence of target pre-compensation over time for simulated data of a block wave push out with noise. The simulated data depict droplet position along the z-axis over time as drive laser 101 is fired in a continuous burst mode with a learning gain equal to 0.5. Bursts are indicated by numbered columns. During burst 1 (when target position 502 is set to primary focal spot 105), a push-out 901 of approximately 25 µm away from focal spot 105 is observed. The push-out is corrected by droplet-to-droplet feedback control which re-aligns the droplet position (albeit later during the burst) back to primary focal spot 105. During the inter-burst interval following burst 1, an updated target position 502 (at approximately −12 µm along the z-axis from primary focal spot 105) is determined (by z-axis controller 603z). When droplet 107 is lased during burst 2, droplet 107 is pushed-out (approximately 25 µm along the z-axis) from updated target position 502 to a position that is only about 10 µm along the z-axis from primary focal spot 105. Because the push-out is smaller than in burst 1, droplet-to-droplet feedback control re-aligns the droplet position back to primary focal spot 105 more rapidly than in the preceding burst 903. As this process iterates, the push-outs become increasingly smaller in magnitude and are more rapidly adjusted during the succeeding bursts with droplet-to-droplet feedback so that droplets remain on-target. In this example, EUV system 100 has learned by burst 4 to pre-compensate target position 502 to a sufficient degree that droplets are pushed (with minimal droplet-to-droplet feedback) to within a reasonable distance 904 of primary focal spot 105 to generate plasma. Error in droplet position along the z-axis over time for the simulated data of FIG. 9 is presented in FIG. 10. As shown, EUV system 100 has reduced the droplet position error 1004 by burst 4 to within 5 µm of primary focal spot 105. As discussed above, plasma generated within 5 µm of primary focal spot 105 optimizes EUV light production.

In another simplified embodiment, neither inter-burst target pre-compensation nor droplet-to-droplet feedback control occurs between bursts. One way to achieve this inoperability is to (1) set error in droplet position to zero (i.e., turn off droplet-to-droplet feedback) during the entire inter-burst interval when the drive laser is not firing so that no droplet-to-droplet feedback action is initiated during inter-burst intervals and (2) turn off inter-burst target pre-compensation. In this embodiment, droplets are targeted towards the primary focal spot and coordination of droplet position with the primary focal spot is adjusted by the droplet-to-droplet feedback within a burst. This embodiment is less expensive to implement, but is less robust in that disturbances within the EUV system can negatively impact performance (e.g., EUV output). For example, if droplet jump (i.e., random droplet movement as, e.g., when debris clogs a nozzle of the droplet generator thereby altering a trajectory of an ejected droplet) is experienced during an inter-burst interval, there is no way to steer the droplet generator back to position until EUV is again being produced. Thus, droplets in a next burst can be greatly displaced from a desired position—and droplet-to-droplet feedback may take a long time or even be unable to reposition droplets to the desired position. Nevertheless, if there are no disturbances within the laser system, this embodiment allows bursts of droplets to settle over a short time (e.g., over 3-4 bursts) to a point where droplets are positioned within an acceptable distance from the primary focal spot.

In another simplified embodiment, an inter-burst deadband is used instead of inter-burst target pre-compensation or droplet-to-droplet feedback control. The deadband is chosen as the region in which the laser beam hits the droplets, and therefore allows droplets to be pushed-out onto the target at every dark-light transient (e.g., at the start of laser burst-firing). The deadband parameters for the droplet generator steering control loop are set such that when droplets are a large distance from the primary focal spot, droplets are steered to the target with droplet-to-droplet feedback, whereas when the droplets are within a close range (e.g., 20 µm) of the primary focal spot, droplets are not actively steered (droplet-to-droplet feedback is inoperable). Since droplets do not drift away during short periods (e.g., a few hundreds of msecs), the inter-burst deadband brings the droplets back onto target at a beginning of exposure more accurately than the droplet-to-droplet feedback control. This embodiment is independent of the amplitude and direction of the push-out, and typically does not need to be calibrated.

In still another embodiment, an inverse control signal can be used in a feed-forward fashion to move actuators to maintain droplets on target instead of inter-burst target pre-compensation or droplet-to-droplet feedback control. In this embodiment, the axial droplet position is determined (as described in step 702 with reference to FIG. 7), after which an inverse of that position is determined. A control signal for that inverse position is sent to actuators to reposition the droplet generator to deliver droplets to an inverse position. Because droplets are generated at a high rate, this embodiment is particularly effective if fast actuators are used to reposition the droplet generator.

The disclosed method and apparatus have been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than those described above. For example, different algorithms and/or logic circuits, perhaps more complex than those described herein, may be used, as well as possibly different types of drive lasers and/or focus lenses. As another example, embodiments of the disclosed system and method have been described with reference to a laser firing in a continuous mode, although embodiments of the system and method herein can also be implemented in a laser firing in a stroboscopic mode.

Further, it should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc., or a computer network wherein the program instructions are sent over optical or electronic communication links. It should be noted that the order of the steps of the methods described herein may be altered and still be within the scope of the disclosure.

It is to be understood that the examples given are for illustrative purposes only and may be extended to other implementations and embodiments with different conventions and techniques. While a number of embodiments are described, there is no intent to limit the disclosure to the embodiment(s) disclosed herein. On the contrary, the intent is to cover all alternatives, modifications, and equivalents apparent to those familiar with the art.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A method of compensating for push-out from a primary focal spot at which sequential target material droplets from a droplet generator are to be lased during burst-firing of an extreme ultraviolet laser light source, the laser light source containing a feed-forward mechanism for correcting for droplet-to-droplet changes in axial position, comprising:
    sensing a plurality of droplets during a burst, the droplets directed toward an initial target position;
    calculating an axial position for each of the sensed droplets;
    determining an inverse of each of the calculated axial positions;
    updating target positions to be the determined inverse of each of the calculated axial positions; and
    commanding one or more actuators to reposition the droplet generator to deliver, during the burst, droplets of target material to the updated target positions.

2. The method of claim 1 wherein the burst is fired within a continuous burst mode.

3. The method of claim 1 wherein the burst is fired within a stroboscopic burst mode.

4. The method of claim 1 wherein the initial target position is the primary focal spot.

5. The method of claim 1 wherein the axial position for each of the sensed droplets is a position along a z-axis.

6. The method of claim 1 wherein the axial position for each of the sensed droplets is a position along a y-axis.

7. The method of claim 1 wherein at least one of the one or more actuators is a fine movement actuator.

8. The method of claim 1 wherein at least one of the one or more actuators is a coarse movement actuator.

9. A system for compensation of push-out from a primary focal spot of target material droplets during burst-firing of an extreme ultraviolet laser light source, the laser light source containing a feed-forward mechanism for correcting for droplet-to-droplet changes in axial position, comprising:
    a droplet generator for generating a plurality of sequential target material droplets;
    a sensor for sensing a plurality of droplets during a burst, the droplets directed toward an initial target position;
    one or more axis controllers for:
        calculating an axial position for each of the sensed droplets;
        determining an inverse of each of the calculated axial positions;
        updating target positions to be the determined inverse of each of the calculated axial positions; and
        generating commands to reposition the droplet generator to deliver, during the burst, droplets of target material to the updated target positions;
    one or more actuators to position the droplet generator based upon the generated commands.

10. The system of claim 9 wherein the burst is fired within a continuous burst mode.

11. The system of claim 9 wherein the burst is fired within a stroboscopic burst mode.

12. The system of claim 9 wherein the initial target position is the primary focal spot.

13. The system of claim 9 wherein the axial position for each of the sensed droplets is a position along a z-axis.

14. The system of claim 9 wherein the axial position for each of the sensed droplets is a position along a y-axis.

15. The system of claim 9 wherein at least one of the one or more actuators is a fine movement actuator.

16. The system of claim 9 wherein at least one of the one or more actuators is a coarse movement actuator.

* * * * *